(12) United States Patent  (10) Patent No.: US 8,186,661 B2
Pitney et al.  (45) Date of Patent: May 29, 2012

(54) WAFER HOLDER FOR SUPPORTING A SEMICONDUCTOR WAFER DURING A THERMAL TREATMENT PROCESS

(75) Inventors: John A. Pitney, St. Peters, MO (US); Thomas A. Torack, Oakland, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 840 days.

(21) Appl. No.: 12/211,516

(22) Filed: Sep. 16, 2008

(65) Prior Publication Data

US 2010/0065696 A1     Mar. 18, 2010

(51) Int. Cl.
*B25B 1/24* (2006.01)
(52) U.S. Cl. .................. 269/266; 269/900; 269/903
(58) Field of Classification Search ............. 269/239, 269/903, 289 R, 900, 266
See application file for complete search history.

(56) References Cited

U.S. PATENT DOCUMENTS

| | | | |
|---|---|---|---|
| 1,852,189 A * | 4/1932 | Powell et al. | 401/278 |
| 4,007,509 A * | 2/1977 | Odhner | 15/207.2 |
| 4,799,659 A * | 1/1989 | Donovan | 269/289 R |
| 5,005,814 A * | 4/1991 | Gumbert | 269/309 |
| 5,067,695 A * | 11/1991 | Huddleston | 269/21 |
| 5,605,574 A | 2/1997 | Tsunashima et al. | |
| 6,214,122 B1 | 4/2001 | Thompson et al. | |
| 6,497,403 B2 | 12/2002 | Ries | |
| 2007/0006806 A1 | 1/2007 | Imai | |
| 2010/0019432 A1* | 1/2010 | Zahnd et al. | 269/296 |
| 2010/0065696 A1* | 3/2010 | Pitney et al. | 248/158 |

FOREIGN PATENT DOCUMENTS

| | | |
|---|---|---|
| JP | 022211650 | 8/1990 |
| JP | 07297155 | 11/1995 |
| JP | 2004259792 | 9/2004 |

OTHER PUBLICATIONS

Written Opinion for PCT/US2009/056807 dated Nov. 27, 2009, 6 pages.

* cited by examiner

*Primary Examiner* — Lee D Wilson
(74) *Attorney, Agent, or Firm* — Armstrong Teasdale LLP

(57) ABSTRACT

A wafer holder for holding a semiconductor wafer during a thermal wafer treatment process. The wafer holder includes at least three wafer supports. Each wafer support includes an upright shaft and a plurality of flexible fibers supported by the shaft in positions such that at least some of the fibers engage the semiconductor wafer when the wafer rests on the wafer supports.

10 Claims, 9 Drawing Sheets

WAFER HOLDER FOR SUPPORTING A SEMICONDUCTOR WAFER DURING A THERMAL TREATMENT PROCESS

FIELD OF INVENTION

The present invention relates generally to a thermal treatment apparatus for a semiconductor wafer, and more particularly to a holder for holding a semiconductor wafer during a thermal treatment process.

BACKGROUND

Thermal processing of semiconductor wafers is common in the semiconductor manufacturing industry. Rapid thermal processing ("RTP") is one common type of thermal processing. RTP involves rapidly heating a semiconductor wafer inside a chamber. The semiconductor wafer may be sliced from a single crystal ingot grown by a method such as the Czochralski method. RTP involves fast temperature ramp rates. For example, a typical RTP system is capable of heating a wafer to about 1200 degrees centigrade or more from room temperature in just seconds. The temperature ramp rates may be as fast as about 200 degrees centigrade per second or more. In some instances, the heating is provided by high-power incandescent lamps. Thermal processing systems using hot plates or microwaves to heat the wafer are also available. The RTP system may "spike anneal" the wafer by rapidly cooling the wafer after heating, also minimizing the dwell time at peak temperature.

Conventional RTP systems treat the wafer while it rests on a wafer holder inside a process chamber. Commonly, the wafer holder comprises support pins that hold the wafer in an elevated position in the chamber. In some RTP systems, the wafer remains stationary during the RTP treatment, which may be controlled by switching the heat source on and off. Alternatively, the heat source may provide continuous heating, in which case the wafer holder moves the wafer in close proximity to the heat source for heating and then moves the wafer away from the heat source for cooling. RTP has been used for a wide variety of purposes, including forming source and drain contact junctions, shallow extension junctions, and electrically active polycrystalline silicon gate electrodes, to name just a few. RTP may also be used to improve internal gettering in silicon wafers as described in U.S. Pat. No. 6,361,619 (Falster), which is incorporated herein by reference.

The semiconductor industry has had a growing demand for wafers having fewer and fewer defects. The areas of the wafer adjacent the support pins during thermal processing treatments, such as RTP, have been found to have more defects than other areas of the wafer. It has been theorized that mechanical stresses introduced by the support pins contribute to the formation of dislocation defects on the back of the wafer, which can then propagate to the front surface of the wafer where they degrade semiconductor devices fabricated on the front surface of the wafer. Thus, semiconductor manufacturers have attempted to reduce the mechanical stresses introduced by the support pins.

Semiconductor manufacturers have also tried to reduce or eliminate uneven heating of the wafer caused by the support pins. Uneven heating causes thermal stresses in the wafer, which may introduce defects to the wafer. In some RTP systems, such as those that heat the wafer with incandescent lamps, the wafer may be heated more than the support pins. Consequently, the cooler support pins may conduct heat away from the wafer, resulting in localized cooling in the vicinity of the support pins. In other wafer thermal processing systems, such as those in which the wafer is supported above a heated susceptor or hot plate, the support pins may become hotter than the wafer. When this happens, heat conducted to the wafer through the support pins may present a thermally opposite situation.

Efforts to reduce uneven heating of the wafer caused by the support pins have been directed to minimizing contact between the support pins and the wafer. For example, U.S. Pat. No. 6,214,122 (Thompson) discloses support pins having "minimum contact points" to reduce mechanical contact between the contact points and the wafer. In other words, the support pins have very sharp points so there is only a small contact area between the support pins and the wafer. Minimizing the contact area between the wafer and the support pins is intended to produce more uniform wafer heating and reduce thermal stresses in the wafer by reducing the conductive heat transfer between the support pins and the wafer.

SUMMARY

One aspect of the invention includes a wafer holder for holding a semiconductor wafer during a thermal wafer treatment process. The wafer holder comprises at least three wafer supports. Each wafer support comprises an upright shaft and a plurality of flexible fibers supported by the shaft in positions such that at least some of the fibers engage the semiconductor wafer when the wafer rests on the wafer supports.

One aspect of the invention includes a wafer holder for holding a semiconductor wafer during a thermal wafer treatment process. The wafer holder comprises at least three wafer supports. Each wafer support comprises an upright shaft and a plurality of flexible fibers supported by the shaft in positions such that at least some of the fibers engage the semiconductor wafer when the wafer rests on the wafer supports.

In yet another aspect, the present invention includes a method of treating a semiconductor wafer. The method comprises supporting the semiconductor wafer so its weight is distributed over a plurality of flexible fibers and heating the wafer to a temperature of at least about 900 degrees centigrade while the wafer is supported by the fibers.

In another aspect, the present invention includes a method of treating a semiconductor wafer. The method comprises setting the semiconductor wafer on a wafer holder. The wafer holder comprises at last three wafer supports. Each of the supports comprises a plurality of flexible fibers. The setting step comprises: (a) resting the wafer on a first fiber of the plurality of wafers; (b) permitting the first fiber to bend under the weight of the wafer; (c) resting the wafer on another fiber; (d) permitting the other fiber to bend under the weight of the wafer; and (e) repeating steps (c) and (d) until the weight of the wafer causes no further bending of the fibers. The method also comprises heating the wafer while it is supported by the fibers.

Other objects and features will in part be apparent and in part pointed out hereinafter.

BRIEF DESCRIPTION OF DRAWINGS

Corresponding reference characters indicate corresponding parts throughout the drawings.

DETAILED DESCRIPTION

Figure 1:
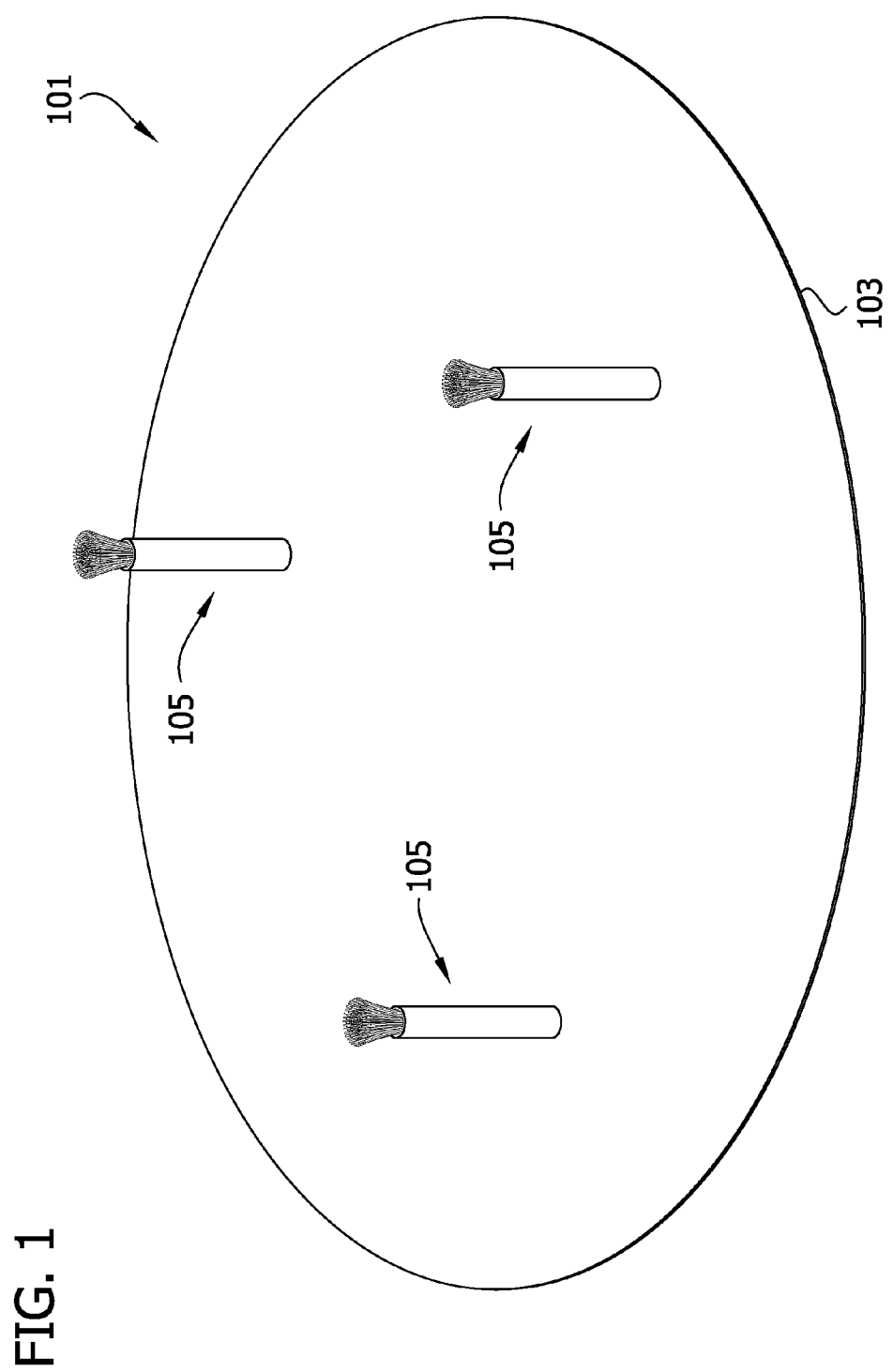
FIG. 1 is a perspective of one embodiment of a wafer holder of the present invention.
Figure 3:
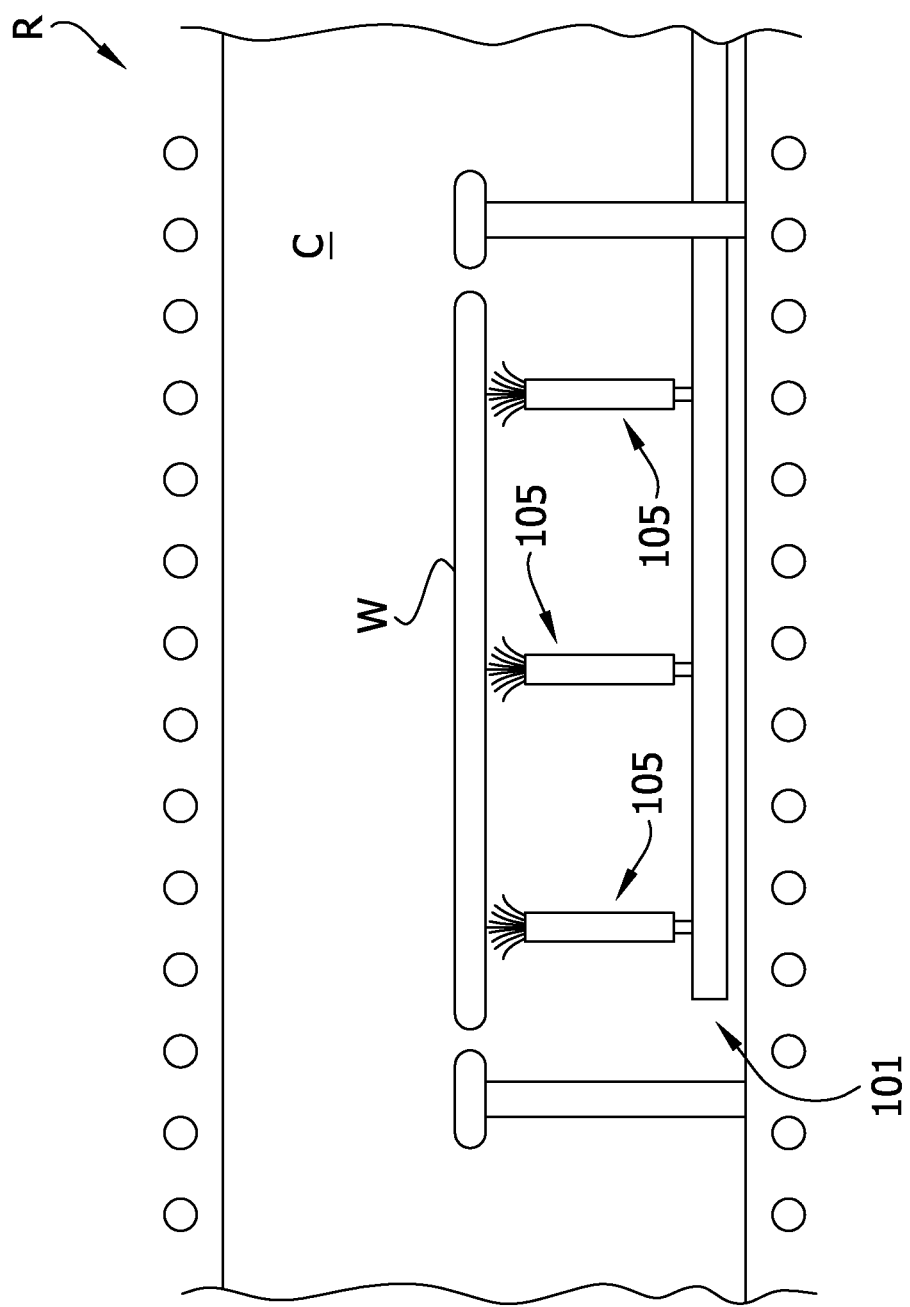
FIG. 3 is a side elevation of the wafer holder supporting a semiconductor wafer in a thermal processing chamber.

Referring to the drawings, and first to FIG. 1, one embodiment a wafer holder is designated in its entirety by the reference number 101. The first embodiment of the holder 101 comprises a base 103 and at least three supports, generally designated by 105, extending upward from the base for supporting a semiconductor wafer W (e.g., a silicon wafer)(see FIG. 3) above the base. The wafer holder 101 is suitable for supporting the semiconductor wafer W when the wafer is exposed to a relatively high temperature. For example, FIG. 3 illustrates the wafer holder 101 supporting a semiconductor wafer W in a chamber C of a rapid thermal processing ("RTP") apparatus, generally designated by R. It is understood that the wafer holder 101 can also be used to support semiconductor wafers W in other thermal treatment processes in which the wafer is exposed to high temperatures (e.g., epitaxial deposition and the like) without departing from the scope of the invention.

The base 103 is suitably made of quartz or another material that is capable of supporting the wafer supports 105 and semiconductor wafer W in a high temperature thermal wafer processing environment. In the illustrated embodiment, the base 103 is a substantially flat unitary slab. However, the construction of the base 103 can vary widely without departing from the scope of the invention. To be suitable for one embodiment of the invention, the base 103 must be capable of supporting the wafer supports 105 and wafer W at high temperatures without releasing excessive undesirable wafer contaminants to the environment. It is contemplated that the base from virtually any conventional semiconductor wafer holder having support pins can be adapted to serve as the base 103 for a wafer holder 101 of the present invention.

Figure 2:
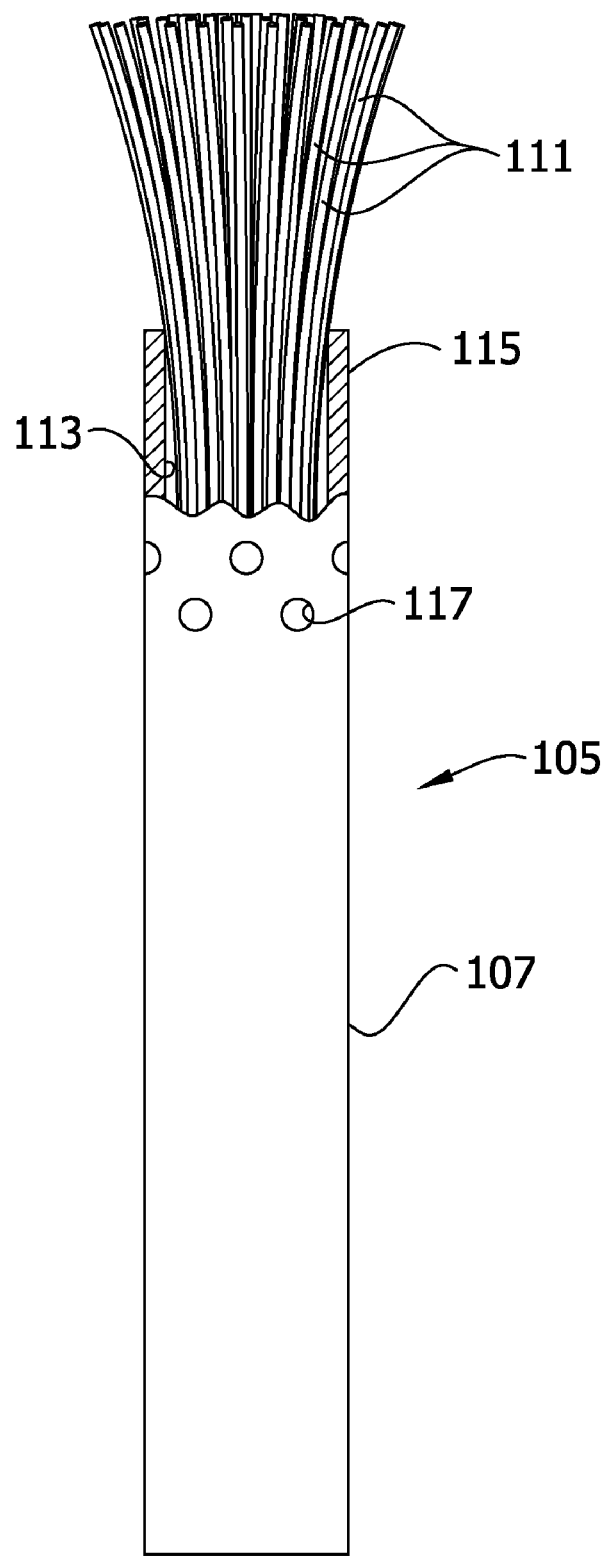
FIG. 2 is an enlarged elevation in partial section of a wafer support of the holder.

In the embodiment shown in the drawings, each of the wafer supports 105 (one of which is illustrated in FIG. 2) is substantially identical. Each wafer support 105 suitably includes an elongate shaft 107 that is secured to the base 103 in a manner such that the base holds the shaft in an upright and generally vertical orientation. The shaft 107 is releasably securable to the base 103 to facilitate replacement of the wafer supports 105 from time to time as needed. For example, the shaft 107 in FIG. 2 may slip fit into an opening (not shown) in the base 103. The wafer supports 105 may be adapted to be releasably secured to the base 103 in the same or equivalent manner as virtually any conventional replaceable wafer supports (e.g., replaceable support pins). In this way, a conventional wafer holder can be converted to a wafer holder 101 of the present invention by replacing conventional wafer supports with wafer supports 105 constructed in accordance with the present invention.

The shaft 107 supports a plurality of flexible fibers 111 in positions such that at least some of the fibers engage the semiconductor wafer W when the wafer sits on the wafer supports 105, as illustrated in FIG. 3. For example, the shaft 107 suitably supports the fibers 111 in positions such that the fibers are engageable with a surface of the semiconductor wafer W oriented so the surface is generally horizontal. The shaft 107 is constructed of a material (e.g., quartz) capable of retaining sufficient structural integrity at high temperatures to support the fibers 111 and at least some of the wafer's weight while the wafer W is exposed to the high temperatures associated with the thermal treatment process. The shaft 107 is desirably constructed of a material that does not release substantial amounts of undesirable wafer contaminants to the environment when heated. The size and shape of the shaft 107 can vary widely within the scope of the invention. In the embodiment illustrated in FIG. 2, for instance, the shaft 107 has a substantially cylindrical shape and a diameter in a range from about 4 millimeters (mm) to about 12 mm. The shaft 107 is suitably constructed so it extends from the base 103 by a distance in a range from about 5 mm to about 12 mm when it is secured to the base 103.

As illustrated in FIG. 2, a cavity 113 extends axially into the shaft 107 at the end of the shaft opposite that secured to the base 103. In one embodiment, this cavity 113 is formed by welding a hollow tube onto a solid post. The cavity 113 suitably has a diameter in a range from about 3 mm to about 11 mm. The fibers 111 are secured to the shaft 107 so the fibers are at least partially extending into the cavity. The fibers 111 are suitably secured to the shaft 107 so at least some of the flexible fibers have a first end (i.e., a bottom end) secured to the shaft and a second end (i.e., a top end) opposite the first. For example, the fibers 111 can be secured to the shaft 107 by gathering a sufficient number of fibers into a bundle such that friction holds the ends of the fibers in the cavity 113 when the end of the bundle is inserted into the cavity. Suitable fibers 111 for bundling in this manner include quartz fibers. The number of fibers 111 in the bundle will vary depending on the diameter of the cavity 113 and the thickness of the fibers. In one embodiment, there is a quantity of fibers 111 in the bundle in a range from about five to about 100.

The fibers 111 in the embodiment shown in FIG. 2 suitably have an average free length measured above the shaft 107 in a range from about 5 mm to about 15 mm (e.g., about 8 mm). The fibers 111 suitably have an average diameter in a range from about 50 microns to about 125 microns (e.g., about 100 microns). The diameter of the fiber bundle is suitably at least about 2 mm. In some embodiments, there is at least one fiber secured to the shaft 107 at a location spaced laterally on the shaft by a distance of at least about 2 mm from a location where an adjacent fiber is secured to the shaft.

The wafer support 105 is configured to limit heat conducted to and from the wafer W through the wafer support. For example, the fibers 111 are suitably made from a material that resists heat conduction (e.g., quartz and the like). Consequently, the fibers 111 suitably have a thermal conductivity of less than about 1.4 watts per meter per degree kelvin (W/m/K). Further, the fibers 111 are arranged so there is at least one space between the fibers, more suitably at least two spaces between the fibers, and still more suitably many spaces between the fibers, as illustrated in FIG. 2. Heat is not conducted efficiently through these spaces in the bundle of fibers 111. As shown in FIG. 2, the cavity 113 in the end of the shaft 107 is defined by a circumferential sidewall 115. In some embodiments, the sidewall 115 has a plurality of openings 117 extending through it to reduce thermal conductivity of the sidewall. The openings 117 may be made using conventional techniques such as drilling. In some embodiments, each opening 117 has a diameter of about one quarter of an outer diameter of the shaft 107. Further, a high density of openings 117 in the shaft 107 shaft is desirable in some of these embodiments. In addition, the shaft 107 has a sidewall thickness in a range between about 1 mm and about 4 mm. In some embodiments, the shaft 107 is a hollow tube, and in other embodiments the sidewall has a height of about 10 mm. In some embodiments, the openings 117 may continue down the full height of the sidewall.

Figure 4A:
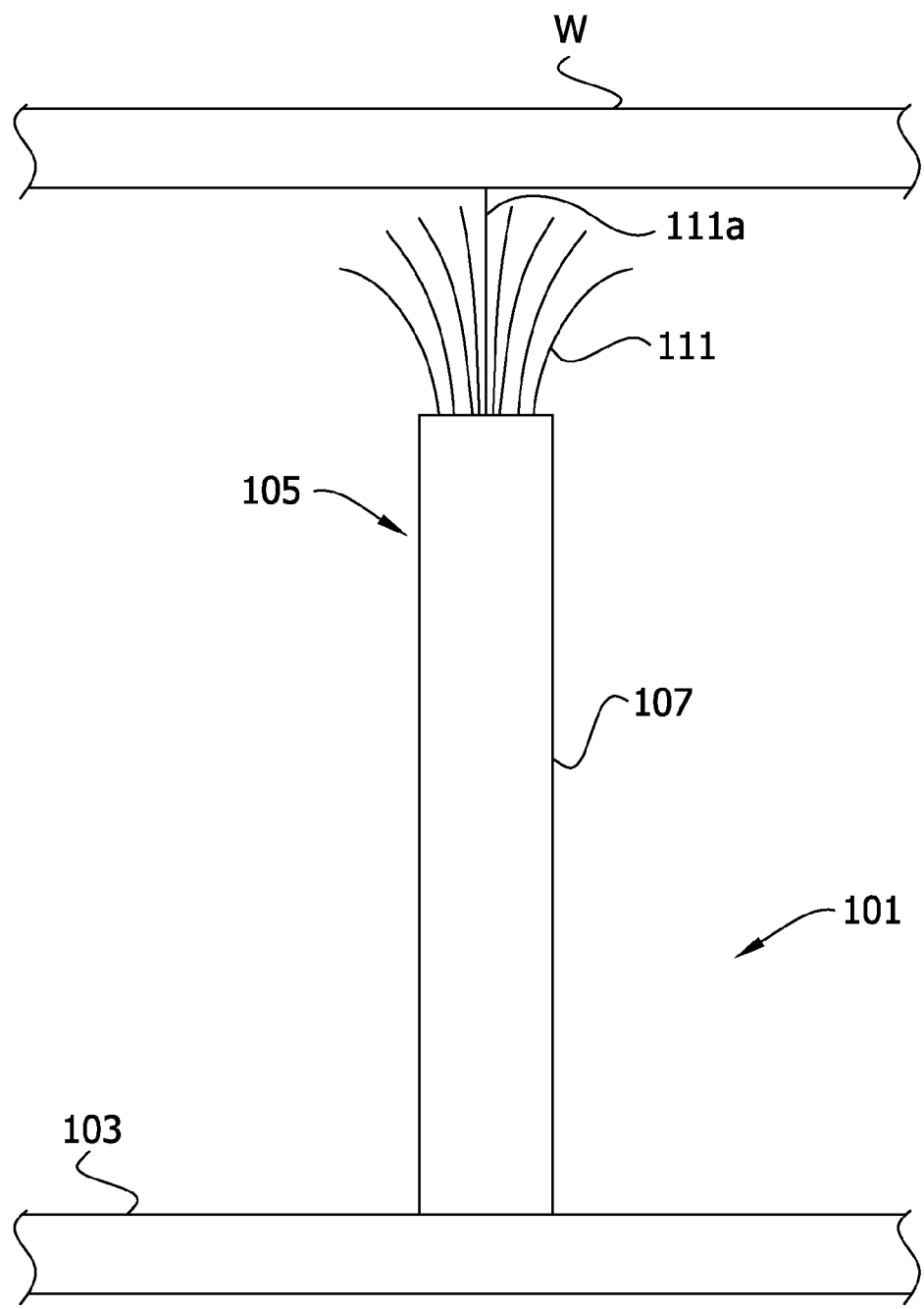
FIGS. 4A-4C are enlarged schematic elevations of a portion of the wafer holder illustrating a sequence in which a semiconductor wafer is set upon the wafer support.
Figure 4B:
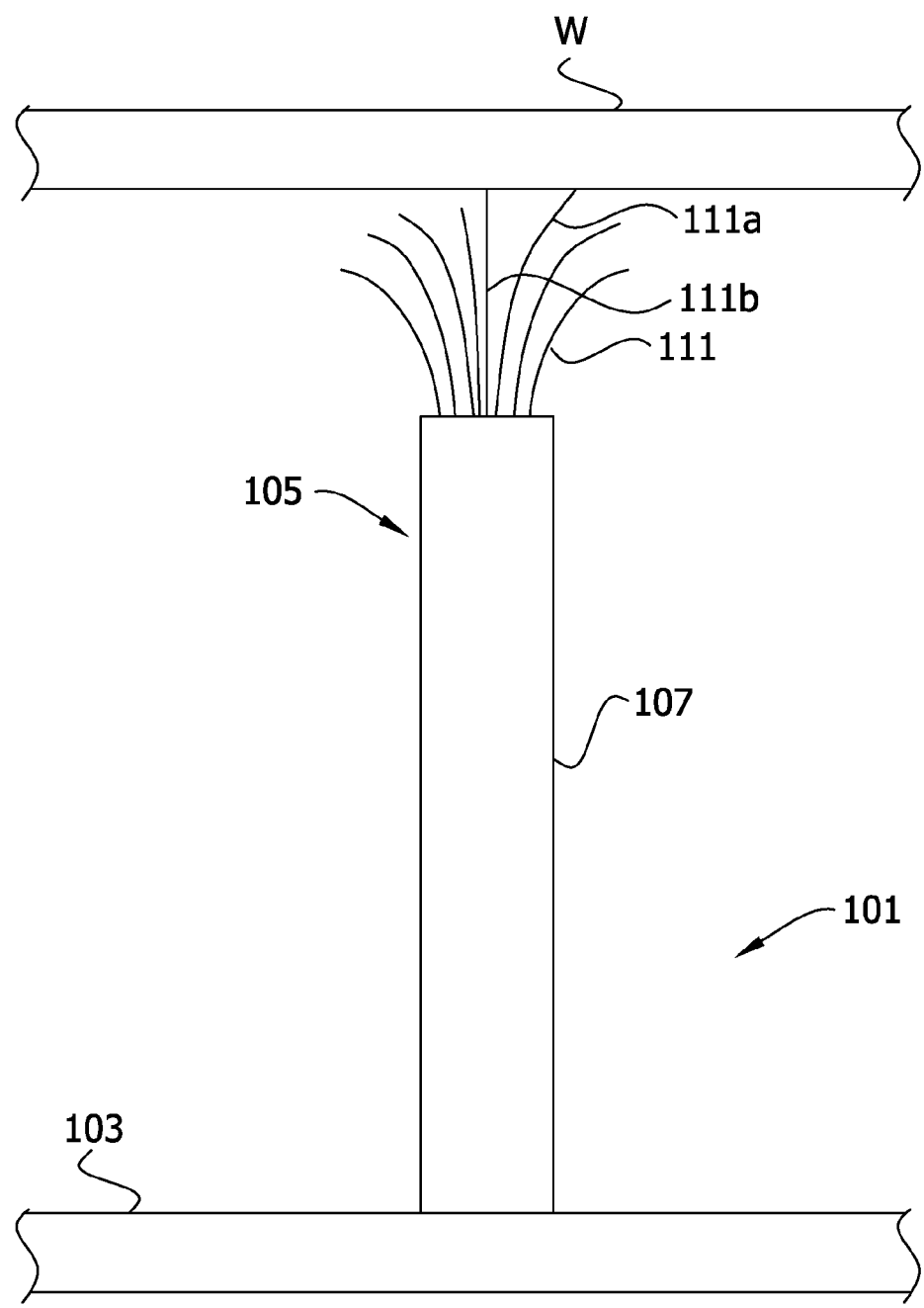
Figure 4C:
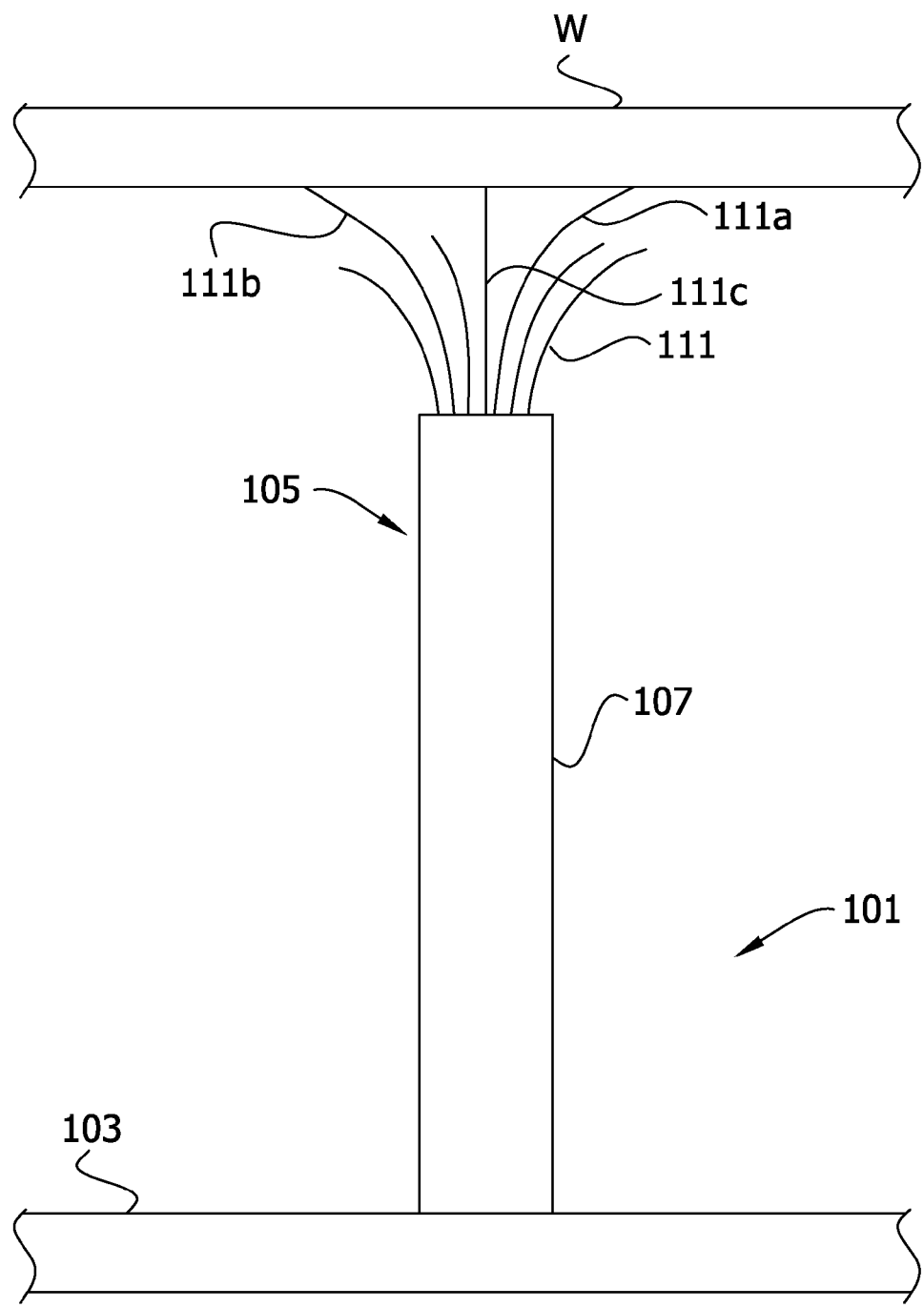

As illustrated in FIGS. 4A-4C, when a wafer W is set on the wafer holder 101 (e.g., by a robot in an automated loading process) the wafer contacts one or more of the fibers 111a (FIG. 4A), which resiliently bend under the weight of the wafer (FIG. 4B). In the process of bending, the first fiber(s) it contacts, the wafer W contacts one or more additional fibers 111b (FIG. 4B). The additional fiber(s) also resiliently bend under the weight of the wafer W (FIG. 4C). Thereafter the wafer W contacts and bends one or more additional fibers 111c. This process continues until the fibers 111 carry the weight of the wafer W without further bending. At this point, the wafer W is supported by the plurality of fibers 111 so the wafer is spaced from the shaft 107 of the wafer support 105 (e.g., by a distance in a range from about 2 mm to about 15 mm) as illustrated in FIG. 3. In one embodiment, the weight of the wafer W is suitably supported by a quantity of fibers 111 in a range from about 2 fibers and to about 50 fibers per wafer support. For example, at least 45 fibers 111 may support the weight of the wafer W when the wafer holder 101 has three wafer supports 105. The fibers 111 of each wafer support 105 contact the semiconductor wafer W at various different positions on the back of the wafer. For example, one fiber 111 of a wafer support 105 may contact the wafer W at a location spaced at least about 2 mm from a location where another fiber of the same wafer support contacts the wafer.

The wafer W is then heated according to the specifications for the particular thermal process that is being conducted while the wafer is supported by the wafer holder 101. For example, the wafer W may by heated to at least about 900 degrees centigrade, and more particularly to at least about 1100 degrees centigrade, and still more particularly to at least about 1200 degrees centigrade while it is supported by the wafer support 105. In some examples, the wafer holder 101 can support the wafer W while it is subjected to an RTP process, an epitaxial deposition process, or the like. Although there may be some difference in the temperatures of the wafer W and the wafer support 105 (or components thereof), the wafer support is also heated to a high temperature similar to the temperature of the wafer in the thermal treatment process.

In contrast to prior art support pins having sharp points designed to minimize the area over which the wafer holder 101 contacts the wafer W, the wafer holder of the present invention reduces the impact of concentrated local mechanical and thermal stresses on the wafer by distributing them over the plurality of fibers 111 of the wafer supports 105. Mechanical damage to the back of the wafer W is limited because the amount of force exerted on the wafer at any particular location by any one of the resiliently yielding fibers 111 is relatively small. Likewise, the low thermal conductivity of the wafer supports 105 limits the damage to the wafer W caused by thermal stress. Similarly, the relatively low thermal conductivity of the fibers 111 results in only minimal heat conducted to or from the wafer W by any of the fibers. Further, mechanical and thermal stresses on the wafer W associated with the wafer supports 105 are distributed over a broader area of the wafer by the plurality of fibers 111, thereby avoiding the highly localized concentration of mechanical and thermal stresses associated with use of the prior art sharp support pins.

Figure 5:
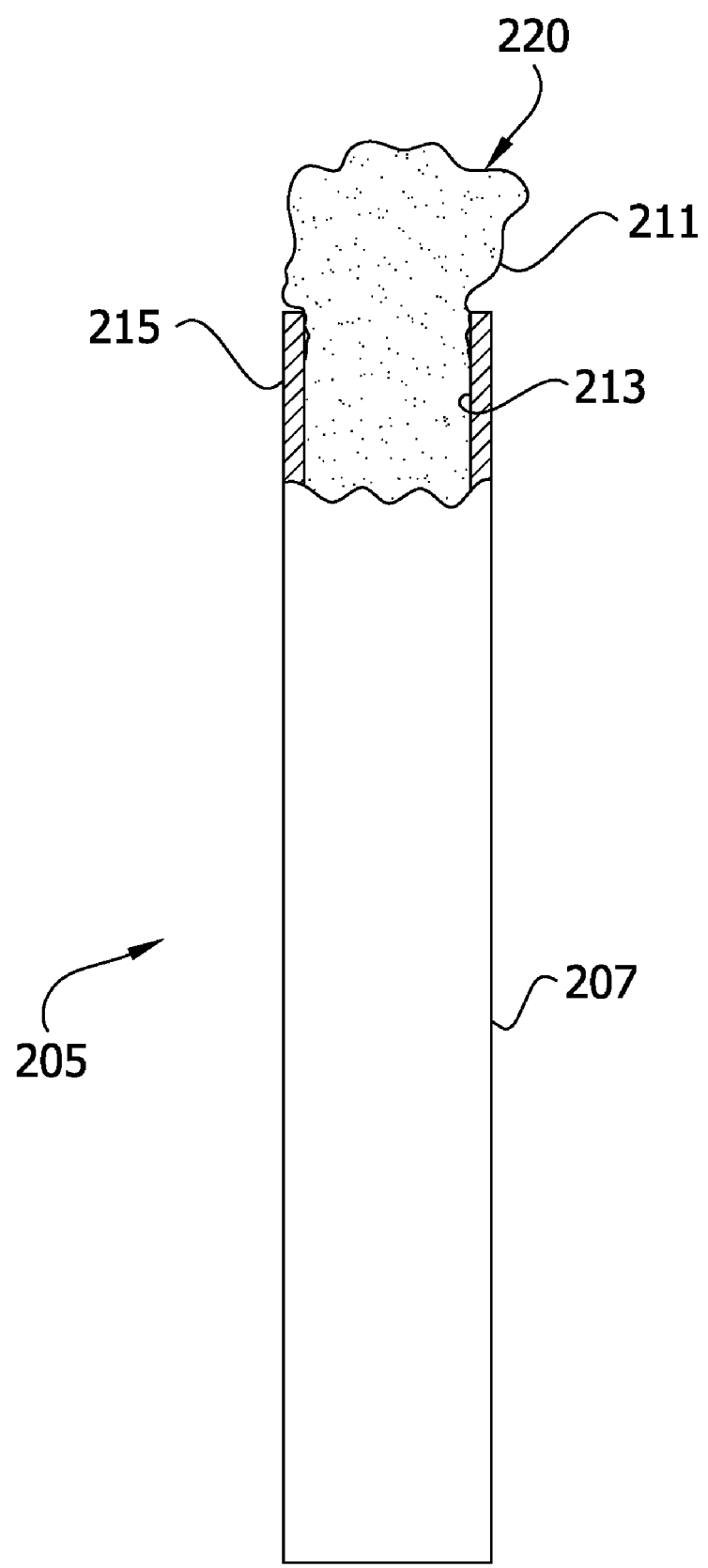
FIG. 5 is an elevation in partial section of a second embodiment of a wafer support of the present invention that can be used in place of the wafer support illustrated in FIG. 2.

There are various ways to construct a wafer support 105 having a plurality of flexible fibers 111 for supporting a semiconductor wafer W within the scope of the invention. FIG. 5 illustrates a second embodiment of a wafer support 205. The wafer support 205 is substantially similar to the wafer support 105 described above and can be used in place of the wafer support described above in the wafer holder 101. In this embodiment, flexible fibers 211 are arranged to form a body, generally designated by 220, of wool. For example, a s fused quartz wool suitable for use in making the wafer support is commercially available from Technical Glass Products of Painesville Township, Ohio. The fibers 211 in the wool body 220 suitably have an average diameter in a range from about 1.5 microns to about 50 microns. The wool body 220 is suitably secured to a shaft 207 by inserting one part of the wool body into a cavity 213 and creating a friction fit between the wool body and a sidewall 215 at the end of the shaft. The opposite end (i.e., the upper end) of the wool body 220 is suitably spaced from the shaft 207 by a distance in a range from about 1 mm to about 5 mm when the first end is secured in the cavity 213. The wool body 220 suitably has a total volume in a range from about 15 $mm^3$ to about 100 $mm^3$. The wool body 220 has a plurality of spaces between the fibers 211 that reduce thermal conductivity of the wool body. This wafer support 205 operates in substantially the same manner as the wafer support 105 described above.

Figure 6:
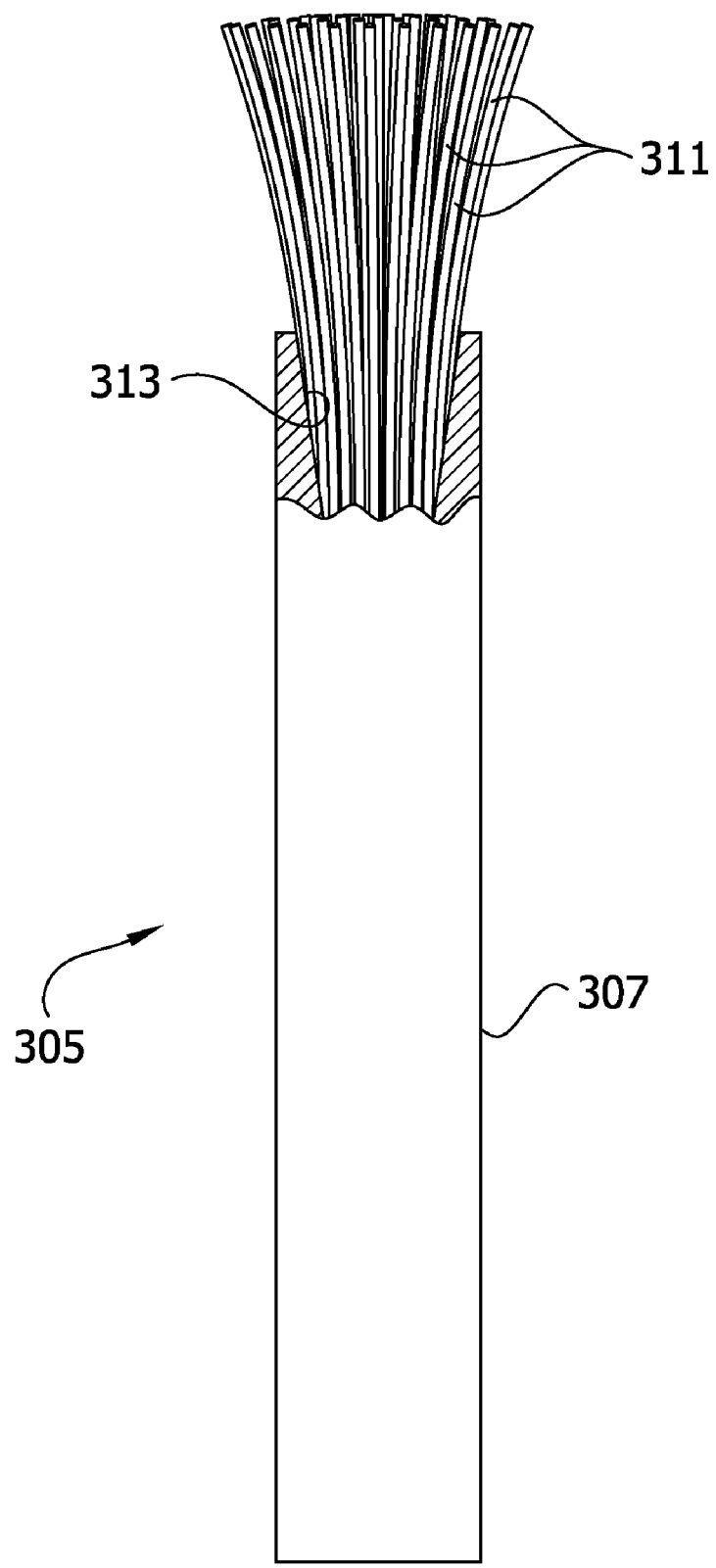
FIG. 6 is an elevation in partial section of a third embodiment of a wafer support of the present invention that can be used in place of the wafer supports illustrated in FIGS. 2 and 5.

FIG. 6 illustrates another embodiment of a wafer support 305 of the present invention. This wafer support 305 is constructed and operates in substantially the same manner as the wafer support 105 illustrated in FIG. 2. A cavity 313 at the end of the shaft 307 is also tapered from a larger diameter at the upper end of the shaft to a smaller diameter away from the end of the shaft. For example, the cavity 313 suitably has a taper in a range from about 0.1° to about 20°. Thus, the cavity 313 is at least slightly tapered and is widest at its mouth. This tapered cavity 313 may improve manufacturability of the wafer support 305 by facilitating insertion of the end of a fiber bundle into the cavity.

Figure 7:
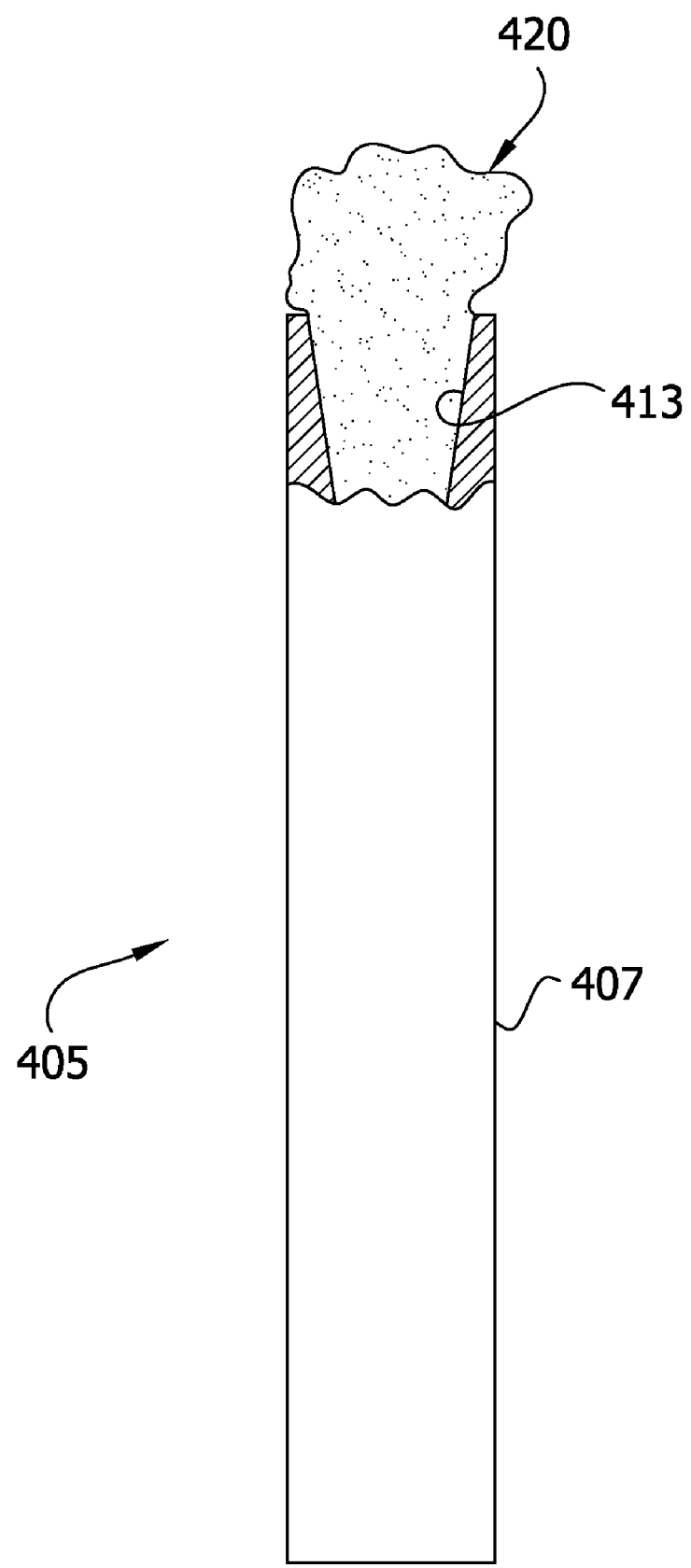
FIG. 7 is an elevation in partial section of a fourth embodiment of a wafer support of the present invention that can be used in place of the wafer supports illustrated in FIGS. 2, 5, and 6.

FIG. 7 illustrates another embodiment of a wafer support 405 of the present invention. This wafer support 405 is constructed and operates in substantially the same manner as the wool body wafer support 205 shown in FIG. 5, except that it has a shaft 407 having a tapered cavity 413 to facilitate insertion of the wool body 420 into the cavity substantially as described for the wafer support 3-5 illustrated in FIG. 6 and discussed above.

When introducing elements of the present invention or the preferred embodiments thereof, the articles "a", "an", "the", and "said" are intended to mean that there are one or more of the elements. The terms "comprising", "including", and "having" are intended to be inclusive and mean that there may be additional elements other than the listed elements.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A wafer holder for holding a semiconductor wafer during a thermal wafer treatment process, said wafer holder comprising at least three wafer supports, each wafer support comprising an upright shaft and a plurality of flexible fibers supported by the shaft in positions such that at least some of the fibers engage said semiconductor wafer when the wafer rests on the wafer supports, wherein at least some of the fibers of at least one wafer support are arranged to form a wool body.

2. A wafer holder as set forth in claim 1 wherein the wool body has first and second opposite ends, the first end is secured to the shaft, and the second end is spaced from the shaft by a distance in a range from about 1 mm to about 5 mm.

3. A wafer holder as set forth in claim 2 wherein the wool body has a total volume in a range from about 15 mm$^3$ to about 100 mm$^3$.

4. A wafer holder as set forth in claim 1 wherein the fibers have an average diameter in a range from about 15 microns to about 50 microns.

5. A wafer holder for holding a semiconductor wafer during a thermal wafer treatment process, said wafer holder comprising at least three wafer supports, each wafer support comprising an upright shaft and a plurality of flexible fibers supported by the shaft in positions such that at least some of the fibers engage said semiconductor wafer when the wafer rests on the wafer supports, wherein the shaft has a circumferential sidewall defining a cavity extending axially into the shaft at one end of the shaft and the fibers are at least partially received in said cavity, and wherein said sidewall has a plurality of openings extending through the sidewall to reduce thermal conductivity of the sidewall.

6. A wafer support for holding a semiconductor wafer during a thermal treatment process, said wafer support comprising an elongate shaft having an end and a plurality of flexible fibers supported by the end of the shaft in positions such that the fibers are engageable with a surface of said semiconductor wafer oriented so said surface is generally horizontal, the fibers being made of a material that retains at least some weight-bearing capacity when exposed to a temperature of at least about 900 degrees centigrade, wherein at least some of the fibers are arranged to form a wool body.

7. A method of treating a semiconductor wafer, the method comprising:
supporting the semiconductor wafer with a support so its weight is distributed over a plurality of flexible fibers;
heating the wafer to a temperature of at least about 900 degrees centigrade while the wafer is supported by the fibers; and
maintaining a structural integrity of the support while conducting a minimum amount of heat to and/or from the wafer.

8. A method of treating a semiconductor wafer, the method comprising:
setting the semiconductor wafer on a wafer holder, the wafer holder comprising at last three wafer supports configured for use in the thermal wafer treatment process, each of said supports comprising a plurality of flexible fibers, the setting step comprising: (a) resting the wafer on a first fiber of said plurality of fibers; (b) permitting the first fiber to bend under the weight of the wafer; (c) resting the wafer on another fiber of said plurality; (d) permitting said other fiber to bend under the weight of the wafer; and (e) repeating steps (c) and (d) until the weight of the wafer causes no further bending of the fibers; and
heating the wafer while it is supported by the fibers.

9. A wafer holder for holding a semiconductor wafer during a thermal wafer treatment process, said wafer holder comprising at least three wafer supports configured for use in the thermal wafer treatment process, each wafer support comprising an upright shaft and a plurality of flexible fibers supported by the shaft in positions such that at least some of the fibers engage said semiconductor wafer when the wafer rests on the wafer supports;
wherein each wafer support has a tapered cavity for receiving the plurality of flexible fibers.

10. A wafer holder as set forth in claim 9 wherein each cavity tapers from a larger diameter at an upper end of the shaft to a smaller diameter away from the upper end of the shaft.

* * * * *